(12) United States Patent
Akram et al.

(10) Patent No.: US 7,090,750 B2
(45) Date of Patent: Aug. 15, 2006

(54) PLATING

(75) Inventors: Salman Akram, Boise, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 420 days.

(21) Appl. No.: 10/228,505

(22) Filed: Aug. 26, 2002

(65) Prior Publication Data

US 2004/0035712 A1      Feb. 26, 2004

(51) Int. Cl.
*C25D 17/00*     (2006.01)

(52) U.S. Cl. ............... 204/199; 204/212; 204/215; 204/222; 204/275.1

(58) Field of Classification Search ........... 204/199, 204/212, 215, 222, 275.1
See application file for complete search history.

(56) References Cited

U.S. PATENT DOCUMENTS

| | | |
|---|---|---|
| 3,798,056 A | 3/1974 | Okinaka et al. |
| 3,915,832 A | 10/1975 | Rackus et al. |
| 4,855,020 A | 8/1989 | Sirbola |
| 5,096,550 A | 3/1992 | Mayer et al. |
| 5,421,987 A * | 6/1995 | Tzanavaras et al. ........ 205/133 |
| 5,472,592 A | 12/1995 | Lowery |
| 5,516,412 A | 5/1996 | Andricacos et al. |
| 5,788,820 A | 8/1998 | Liu |
| 5,893,966 A | 4/1999 | Akram et al. |
| 6,033,548 A | 3/2000 | Akram et al. |
| 6,083,376 A | 7/2000 | Akram et al. |
| 6,132,570 A | 10/2000 | Akram et al. |
| 6,267,853 B1 * | 7/2001 | Dordi et al. ............. 204/232 |
| 6,277,262 B1 | 8/2001 | Akram et al. |

* cited by examiner

*Primary Examiner*—Arun S. Phasge
(74) *Attorney, Agent, or Firm*—TraskBritt

(57) ABSTRACT

An apparatus and method for treating a substrate to deposit, clean or etch material on a substrate using a first horizontal chuck to which a plurality of substrates is attached and electrically charged. Spaced closely to the first horizontal chuck is a coextensive horizontal second chuck which receives and showers reaction solution over all portions of each substrate. During the reaction process, both chucks are substantially submerged in reaction solution within a tank. At least one of the chucks is attached and controllable from a control arm. At least one of the chucks is rotated about a vertical axis at a slow speed during the reaction process. The axes of rotation of the two chucks may be coincident, or the axes may be offset from each other, and/or one or both axes may be offset from the chuck centerpoint(s). One of the chucks may also be periodically moved in a vertical direction relative to the other chuck.

65 Claims, 13 Drawing Sheets

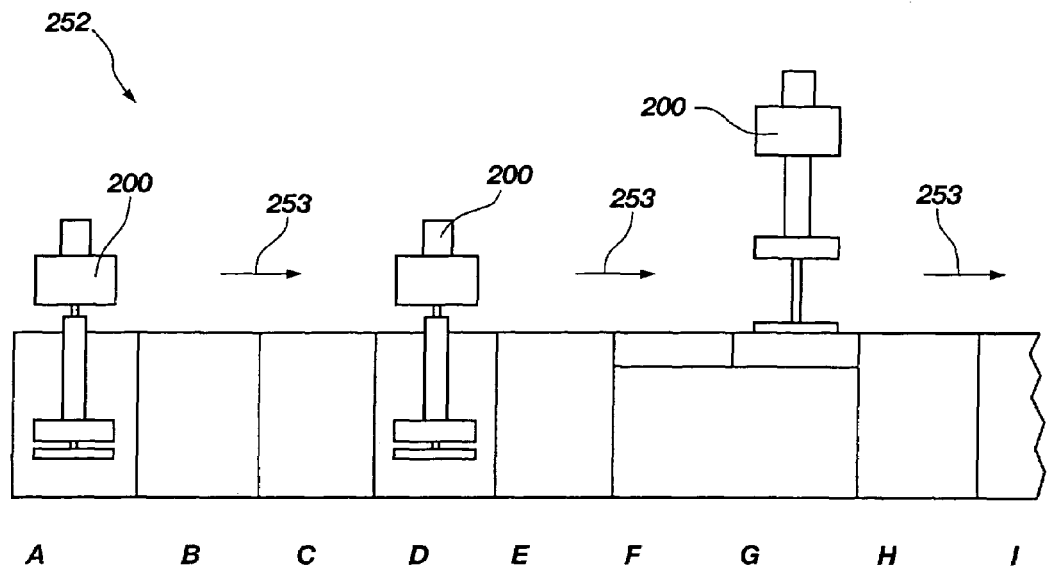
FIG. 14
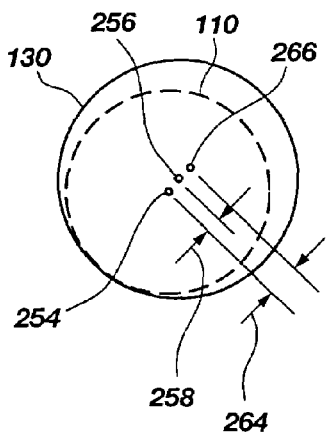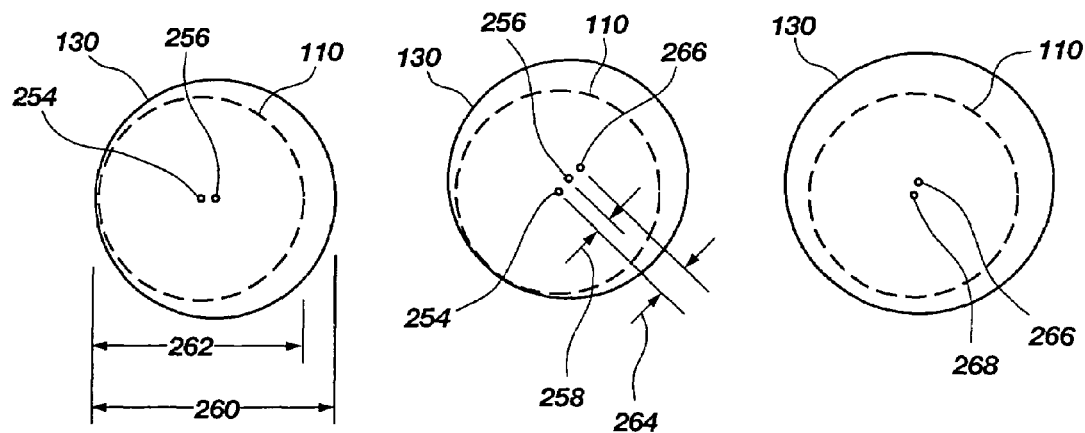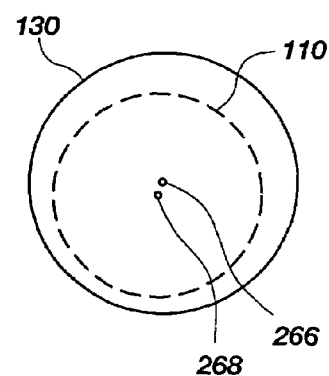
FIG. 15　　FIG. 16　　FIG. 17

PLATING

BACKGROUND OF THE INVENTION

1. Field of the Invention

The present invention relates generally to apparatus and methods for inducing an electrochemical, chemical and/or mechanical reaction on an article. More particularly, the invention pertains to methods and apparatus for treating substrates including electrodeposition of material thereonto, such as through anodizing, etching, polishing, and cleaning.

2. State of the Art

Semiconductor wafers, substrates and printed circuit boards (collectively hereinafter "semiconductor substrates") are often coated with various materials, such as metals which are etched in later semiconductor fabrication processes to form components on the semiconductor substrates. Techniques for coating semiconductor substrates include electrodeposition, electron beam evaporator deposition, chemical vapor deposition, sputter deposition, electroless plating and the like. Electrodeposition has become a commonly used technology.

Electrodeposition or electrolytic deposition is a process which deposits a thin film of material, such as metal or metal alloy, on an article. In electrodeposition, as shown in prior art FIG. 1, an article 10 is placed in a tank 12 containing an appropriate deposition solution, such as an electrolyte solution 14, which contains ions 16 of a metal to be deposited on the article 10. The article 10 forms a cathode or is in electrical contact with a cathode 18 which is immersed in the electrolyte solution 14. The cathode 18 is connected to a negative terminal 20 of a power supply 22. A suitable anode 24 is also immersed in the electrolyte solution 14 and connected to a positive terminal 26 of the power supply 22. The electrical current causes an electrochemical reaction at the surface of the article 10 which results in the metal ions 16 in the electrolyte solution 14 being deposited on the article 10.

With semiconductor devices, it is generally desirable to deposit the metal film with a uniform thickness across the article and with uniformity of composition of the metal(s) and/or other compounds forming the metal film. However, the electrodeposition process is relatively complex and various naturally occurring forces may result in a degradation in the electrodeposition process. The electrical current or flux path between the anode and the cathode should be uniform without undesirable spreading or curving to ensure uniform deposition. Additionally, since the metal ions in the deposition solution are deposited on the article, the deposition solution becomes depleted of metal ions, which degrades the electrodeposition process. Therefore, suitable controls are required to introduce metal ions into the deposition solution in order to maintain consistency.

U.S. Pat. No. 5,516,412 to Andricacos et al. relates to an electrodeposition cell having a rack for vertically supporting a silicon substrate to be electrodeposited. An opposing wall of the cell comprises an anode. A paddle is disposed within the cell for agitating an electrolytic solution within the cell to maintain a uniform distribution of deposition material within the electrolyte solution. Furthermore, Andricacos et al. teaches that the rack can be designed to be removable for automated handling. Although Andricacos et al. addresses the control issues discussed above, the rack assembly disclosed is not conducive to high-volume manufacturing. Furthermore, Andricacos et al. does not describe, teach, or suggest any means for improving the deposition on the silicon substrate by the movement of either the anode or cathode.

U.S. Pat. No. 3,798,056 to Okinaka et al. discloses a rotating substrate holder having substrates mounted vertically about a vertical shaft. Periodic reversal of rotation is disclosed. The system relates to electroless autocatalytic plating and is unrelated to electrodeposition.

U.S. Pat. No. 3,915,832 to Rackus et al. shows apparatus for mounting and electroplating lead frames to obtain greater plate thicknesses at the lead frame ends. Lead frames are mounted radially about a tubular cathodic member which is rotated about a vertical axis while an electrolytic solution is induced to flow downwardly past the rotating mount. There is no positive control over solution movement at the lead frame surfaces.

U.S. Pat. No. 4,855,020 to Sirbola describes the electroplating of computer memory disks wherein disks are mounted on a horizontal spindle and rotated in an electrolyte bath. Coplanar anodes are spaced from each side of the disk and are coplanar to only a portion of the disk.

U.S. Pat. No. 5,472,592 to Lowery shows an electrolytic plating apparatus having a rotatable vertical shaft carrying a set of anodes. Attached to the vertical shaft is an arm about which a vertical wheel is rotated by contact with a track in the tank floor. A substrate is mounted in a vertical configuration to the wheel and is rotated by wheel rotation as the wheel travels about the vertical shaft. Virtually no control of electrolyte uniformity is exercised.

In U.S. Pat. No. 5,421,987 to Tzanavaras et al., an electroplating cell includes a horizontally rotatable anodic spray head. Electrolyte is sprayed through an intervening collimating ring onto a stationary substrate to create high turbulence at the surface. The spray head is shown with three diametrical rows of spray nozzles which cover less than the entire substrate at any time. Depending upon the location of a die in the substrate, each die may receive either one, two, or six pulses of electrolyte. To compensate, the nozzles are of differing spray design and flow rate. The limited numbers of nozzles are varied. Although not shown, it is stated that the substrate may alternatively be rotated.

Systems which are used for electrodeposition may also be used for electropolishing, electroetching, and the like. For example, U.S. Pat. No. 5,096,550 to Mayer et al. teaches attaching an article to a rotating anode positioned horizontally facedown in a polishing or etching bath. However, Mayer et al. teaches only the motion of the cathode and, since the articles are attached and treated one at a time in the anode, the apparatus of the Mayer et al. is not conductive to high-volume manufacturing.

In most electrodeposition techniques, the wafers are attached to the cathode. The attachment of wafers to the cathode can lead to significant problems, especially as the wafer quantities are increased within a single batch, control of the thickness of plated material may vary from semiconductor die to semiconductor die being manufactured on any wafer. This problem results from uniformity of metal ions and current density in the electrolyte solution adjacent the wafer surface.

It is desirable to provide highly uniform thickness and composition of deposition material on an electrodeposited article or to uniformly polish or etch an article. Furthermore, it is also desirable to do so in an apparatus capable of high-volume manufacturing, preferably using automated handling equipment.

BRIEF SUMMARY OF THE INVENTION

In one embodiment, the apparatus of the present invention may comprise a housing tank containing a reaction solution, such as a deposition solution (e.g., an electrolyte solution). A first chuck may be submerged in the housing tank, and articles having surfaces to be treated are mounted on the first chuck. Article surfaces are subjected to multiple vertical flows of reaction solution projected in a generally normal direction to the article surfaces. The articles may be, for example, a plurality of semiconductor wafers, other substrates, or any articles which may be attached to the first chuck for treatment. For articles with generally planar surfaces to be treated, e.g., semiconductor wafers, substrates and printed circuit boards, etc., the surfaces are maintained by the first chuck in a substantially horizontal position when compared to a substantially vertical position.

A second chuck with a generally planar front surface comprises a "shower head" and contains a large number of orifices located in, located on, or located by extending through a planar web through which the reaction solution is showered onto the closely spaced first chuck to intimately contact and treat the articles mounted thereon. The planar web is generally parallel to the substrate surfaces and is closely spaced therefrom. One or both of the first and second chucks is/are rotated about a vertical axis to create a relative velocity therebetween. This movement achieves continuous, substantially complete coverage and movement of a uniform concentration of reaction solution over each microportion of each article on the first chuck. The chuck rotation also serves to mix the tank contents, and blades may be attached to the periphery of one or both chucks to enhance such mixing.

The first chuck may be positioned either below or above the second chuck, depending upon (a) the particular application, i.e., electrodeposition, electroetching, electropolishing, or the like, and (b) article topography, as well as other factors. The chucks are closely positioned to provide the desired forced flow over the article surfaces and rapid exit of reaction solution from the chuck (and substrate) surfaces.

At least one of the chucks is configured to be rotated at a relatively low speed. Such rotation mixes the reaction solution within the housing tank to ensure uniformity. Small mixing blades may be attached to the periphery of the rotatable chuck(s) if desired to enhance the mixing level. The differential rotation between the chucks also ensures that the moving sprays of solution impinge on each microportion of all of the articles. If desired, the direction of rotation may be reversed during the deposition period to change the direction of solution impingement on the substrates. In addition, chuck movement may include axial movement to periodically widen and narrow the web-to-substrate distance. This movement may be conducted at a high frequency by attaching an ultrasonic device to the second chuck to enhance intimate contact of the reaction solution with the substrates. Ultrasonic movement may be controlled to be particularly useful in electrodeposition, etching, polishing, and the like.

For use in electrodeposition, i.e., electroplating, the first chuck includes conductors for connecting the attached articles to a cathode of a power supply. The voltage and/or current may be separately controlled for each article to achieve the desired deposited thickness. The second chuck includes metal electrodes in or on the second chuck. The metal electrodes are connected to an anode of a power supply to provide contact of the flowing reaction solution with a positively charged surface.

For use in etching or polishing, the anodic and cathodic members may be reversed in charge. Simple etching, cleaning and polishing may be conducted by not using, or removing, the anodic and cathodic members from the apparatus.

The apparatus enables treatment of substrates in a horizontal configuration or orientation with respect to a vertical orientation wherein all substrate surfaces to be treated are fully submerged in freshly introduced reaction solution of substantially uniform composition for achieving uniform treatment both between different substrates as well as differing portions of each substrate or the same substrate.

The invention will become apparent and understood from a reading of the description of the invention when taken in conjunction with the attached drawings.

BRIEF DESCRIPTION OF THE DRAWINGS

The invention is illustrated in the following figures, wherein:

FIG. 14 is a schematic front view of a production line for making electronic devices on semiconductor wafers in a semicontinuous line with an electrodeposition apparatus of the invention;

FIG. 15 is a schematic plan view of a second chuck overlying a first chuck of an electrodeposition apparatus of the invention in a first mode;

FIG. 16 is a schematic plan view of a second chuck overlying a first chuck of an electrodeposition apparatus of the invention in a second mode;

FIG. 17 is a schematic plan view of a second chuck overlying a first chuck of an electrodeposition apparatus of the invention in a third mode.

DESCRIPTION OF THE PREFERRED EMBODIMENTS

The apparatus of the present invention is so constructed that a plurality of substrates such as semiconductor wafers, substrates and printed circuit boards, etc. may be simultaneously electroplated to achieve a highly uniform applied material thickness.

Although the present invention may be used for electrodeposition, etching or polishing, the following description describes the electrodeposition of material onto a substrate. The apparatus and method of the invention are exemplified in the plating of a metal onto conductors of an interconnected plurality of semiconductor dice being or having been formed on one or more semiconductor wafers. From the following description, it will be understood that one skilled in the art may apply the description of the invention to etching, polishing, and the like for semiconductor wafers, substrates, printed circuit boards, etc. and the like.

Figure 1:
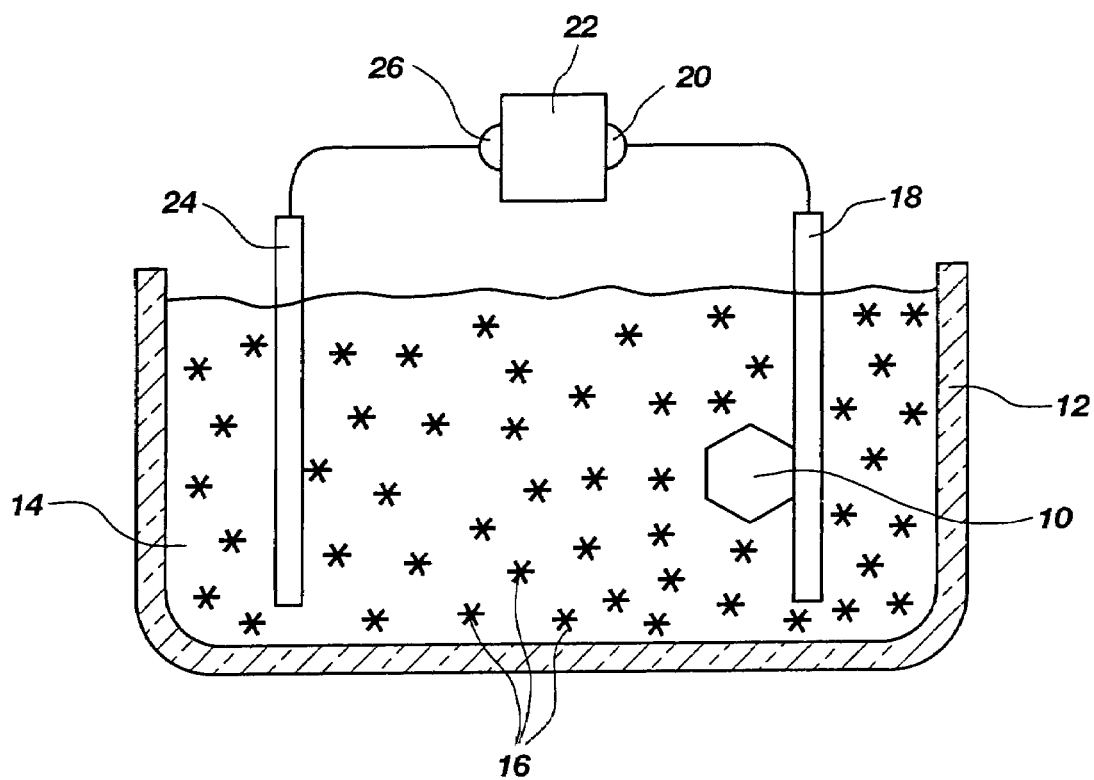
FIG. 1 is a general cross-sectional side view of a prior art electrodeposition apparatus.
Figure 2:
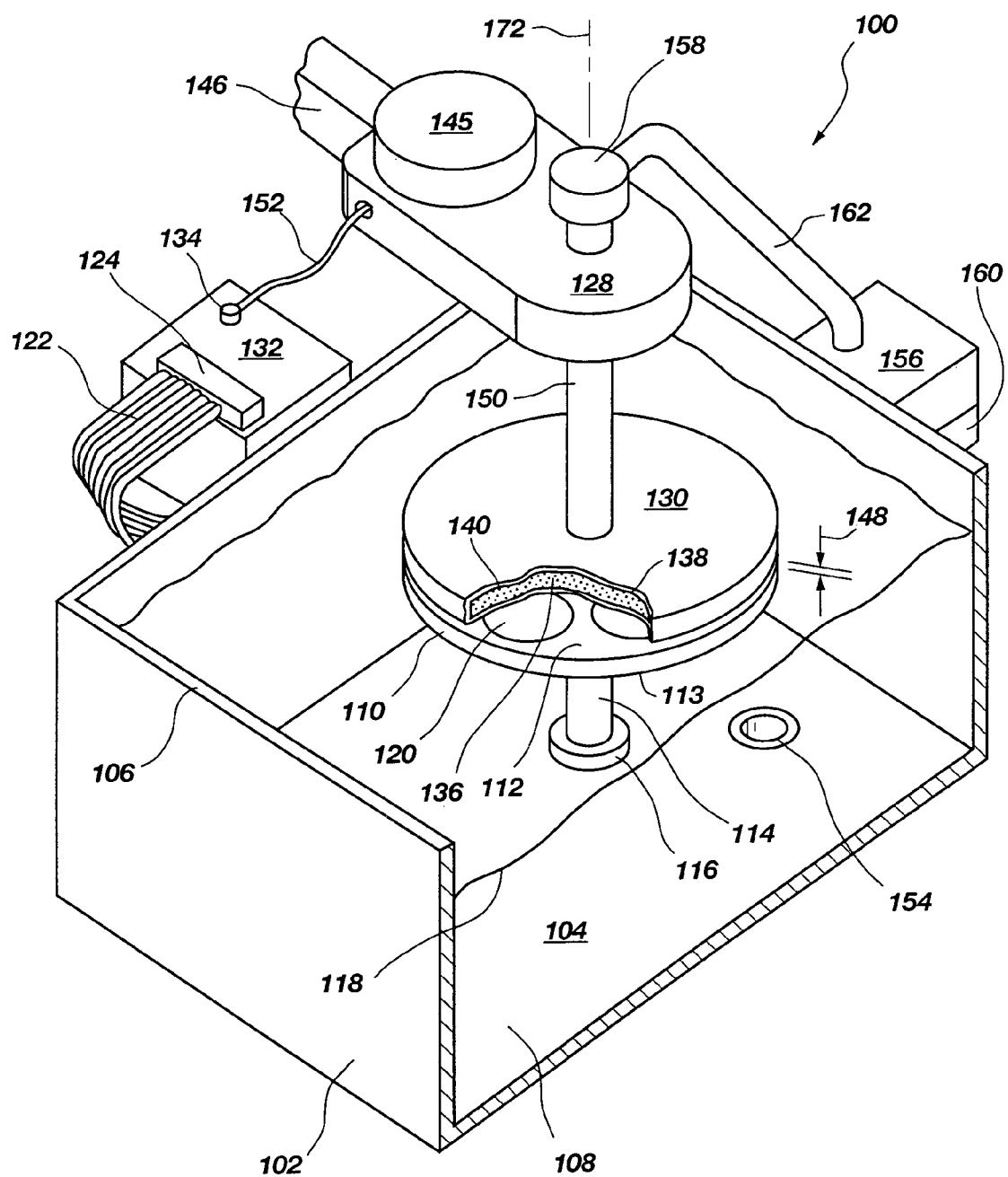
FIG. 2 is a general isometric cross-sectional view of an electrodeposition apparatus in accordance with the present invention.

Illustrated in drawing FIG. 2 is an exemplary electrodeposition apparatus 100 of the invention. The apparatus 100 comprises a housing tank 102 for retaining a reaction solution 108 such as an electroplating solution. The housing tank 102 is preferably formed of a nonconductive material which does not react with the reaction solution 108, such as poly(methyl-methacrylate) or polypropylene, for example. The housing tank 102 preferably has an open top 106 through which electrodeposition equipment may be inserted and removed. The reaction solution 108 in housing tank 102 may be controlled at a desired level 118.

As shown in drawing FIG. 2, a first chuck 110 with a horizontal planar surface 112 is adapted for holding a plurality of substrates 120, shown here as semiconductor wafers. In this embodiment, the first chuck 110 is supported by a vertically oriented shaft 114 which is attached to the tank bottom 104 or passes through a bearing seal 116 in the tank bottom for rotation by a lower drive unit 126 (see FIG. 9, for example). The shaft 114 is hollow and contains conductors 122 which connect each substrate 120 to a cathode 124 of a controllable power supply 132 to place a controlled negative electric charge on each substrate. The first chuck 110 is shown as generally circular in plan view, but may have other shapes, e.g., square, hexagonal, etc., and may optionally be perforated to permit fluid flow from its mounting surface 112 to its back side 113. Preferably, the first chuck 110 is circular. Where the substrates are of other shapes, the first chuck 110 may be of any useful shape, even reticulated. The substrate-retaining chuck 110 may comprise an anode, or the first chuck 110 and shaft 114 may be formed of a nonconductive material, or insulated to prevent their participation in the electrolytic reactions. In this variant, a positive charge may be placed on the substrates 120 via conductors 122. The charge voltages and currents may be controlled individually for each substrate 120 for achieving differing deposition thicknesses. The charge on an individual substrate 120 may be controlled to avoid deposition altogether.

A second chuck 130 is shown in drawing FIG. 2 as a shower head with a hollow core 140 and a substantially planar spray web 136 with a large number of flow orifices 138 leading from the hollow core 140 to the exterior of second chuck 130. The size of the second chuck 130 is such that its spray pattern will completely uniformly cover the substrates 120 mounted on the first chuck 110 with a continuous flow of reaction solution 108. The second chuck 130 is attached to a hollow drive shaft 150 which is shown suspended from a drive 128 which may be controlled to rotate the drive shaft 150 about upper axis of rotation 172. The drive 128 is motivated by motor 145 and is, in turn, mounted on a control arm 146 for aligning and maintaining the second chuck 130 at a desired position in the horizontal X axis and Y axis as well as the vertical Z axis and to maintain a specific web-to-substrate spacing 148 (see FIG. 8). One or more conductors 152 are connected between an anode 134 of controllable power supply 132 or another power supply and pass through hollow drive shaft 150 to contact a portion of the second chuck 130 to form and maintain a positive charge thereon. Where a shaft(s) is to be rotated, the electric conductor(s) will include brush sets, not shown, or other devices as known in the art, for making electrical connection to portions of the attached chuck(s). The flow orifices 138 may be suitable flow nozzles located on surface 137 of the second chuck 130, or in recesses in the surface 137 of the second chuck 130 (see FIG. 4).

It is important that at least one of the first chuck 110 and the second chuck 130 be rotated substantially continuously during the electrodeposition period. The spacing 148 between the planar spray web 136 and substrates 120 should be sufficiently limited to increase the solution velocity over the substrates. In depositing materials on semiconductor wafers, substrates, printed circuit boards, and the like, the substrates 120 should not be exposed to the bulk liquid in the housing tank 102, inasmuch as the bulk liquid will, in general, have a slightly lower titer than the incoming reaction solution 108, even if the latter is not augmented to increase its titer. Thus, the ionic solution strength in contact with the substrates 120 is maintained at a high level, maximizing the deposition rate and providing a high level of uniformity in deposition depth. The spacing 148 between the planar spray web 136 and substrates 120 may generally vary from about 1 mm to about 10 mm. For most purposes, the first 110 and second 130 chucks are maintained in a submerged position during the particular treatment process.

The rotation rate required to achieve high uniformity in electrodeposition is very low when compared to existing apparatus. A rotation rate may vary from about 0.1 to about 3 rpm, or somewhat higher. The net rotation velocity may be achieved by rotating the first chuck 110, rotating the second chuck 130, or rotating both chucks 110 and 130 to achieve a differential velocity. For example, the two chucks may be counter-rotated (relative to each other) at slow speeds, wherein the net differential velocity is the total of the two rotative velocities relative to the housing tank 102.

As depicted in drawing FIG. 2, reaction solution 108 may be recirculated through the electrodeposition housing tank 102, where solution is passed through drain 154 to a pump 156, which recirculates the solution via tube 162 to a rotating fitting 158 on hollow drive shaft 150. The recirculated reaction solution 108 passes through the hollow drive shaft 150 to supply the shower head of the second chuck 130 with recirculated reaction solution 108. Typically, the depleted reaction solution 108 draining from the housing tank 102 may be filtered to remove solids, such as by filter 160, as known in the art. Fresh materials may also be fed to the recirculated solution to replenish materials lost by deposition onto the substrates 120. Apparatus for replenishing the titer of depleted solutions is well known in the art and will not be further discussed here.

Figure 3:
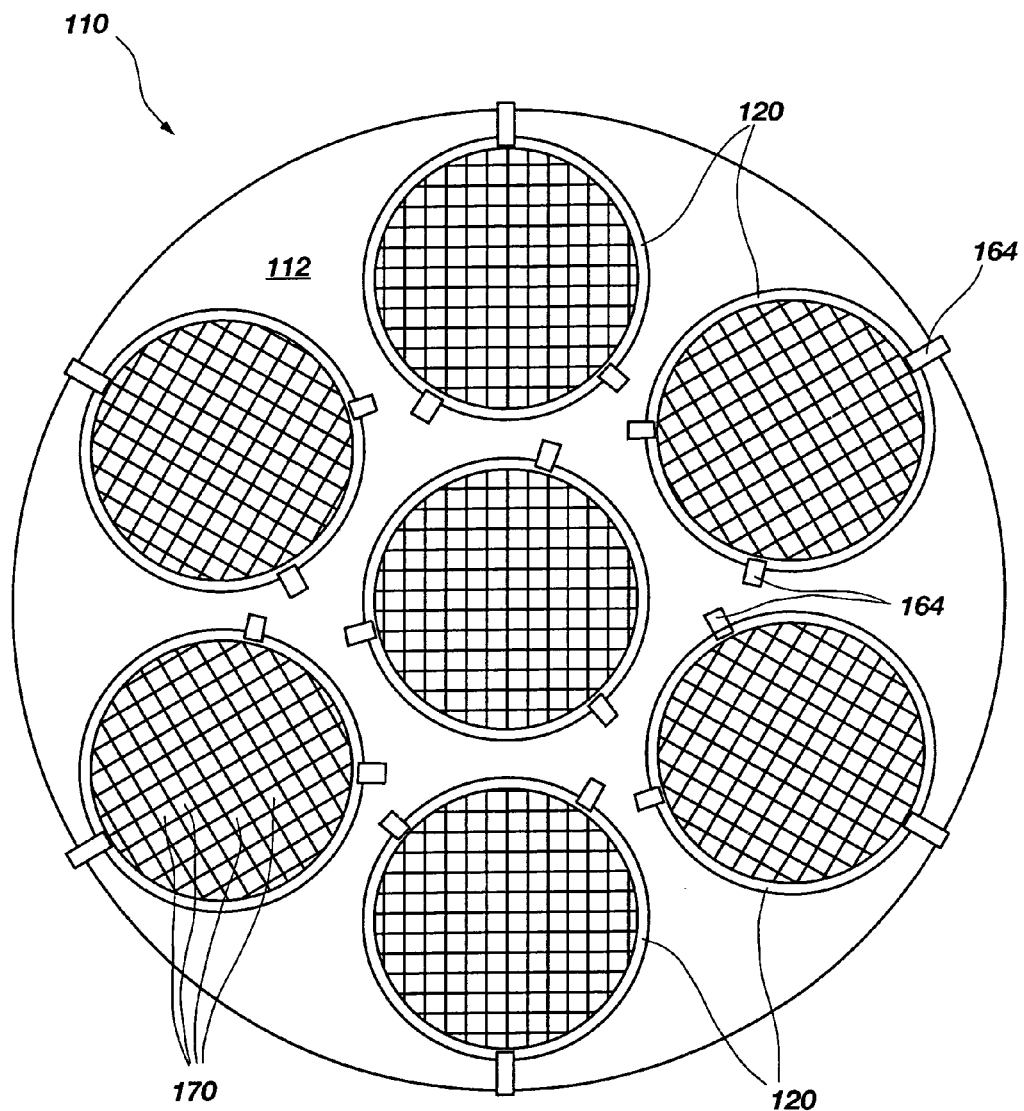
FIG. 3 is a plan view of an exemplary mounting surface of a substrate-retaining cathodic chuck of the present invention.

Turning now to drawing FIG. 3, depicted is an example of a first chuck 110 specifically configured for electrodeposition on substrates 120 comprising multi-chip semiconductor wafers. The first chuck 110 may be of any desirable size to accommodate, for example, a substantial number of wafers 120. For example, all wafers 120 originating from a specific boule may be processed together as a batch. As shown in drawing FIG. 3, seven wafers of the same general size are affixed to the surface 112 of first chuck 110 by clips 164. The clips 164 may also serve as electrical connectors to place a charge on the substrates 120. Each substrate 120 (wafer) may be electrically biased individually to achieve a desired deposition thickness. The configuration of the first chuck 110 may vary widely but will, in general, retain a plurality of substrates in the shower stream from the second chuck 130. It may be noted that substrates 120 may be attached to a first chuck 110 by any suitable attachment device. For example, wafers may be attached with clips as shown, with clamp rings which are tightened or with other devices as known in the art.

Figure 4:
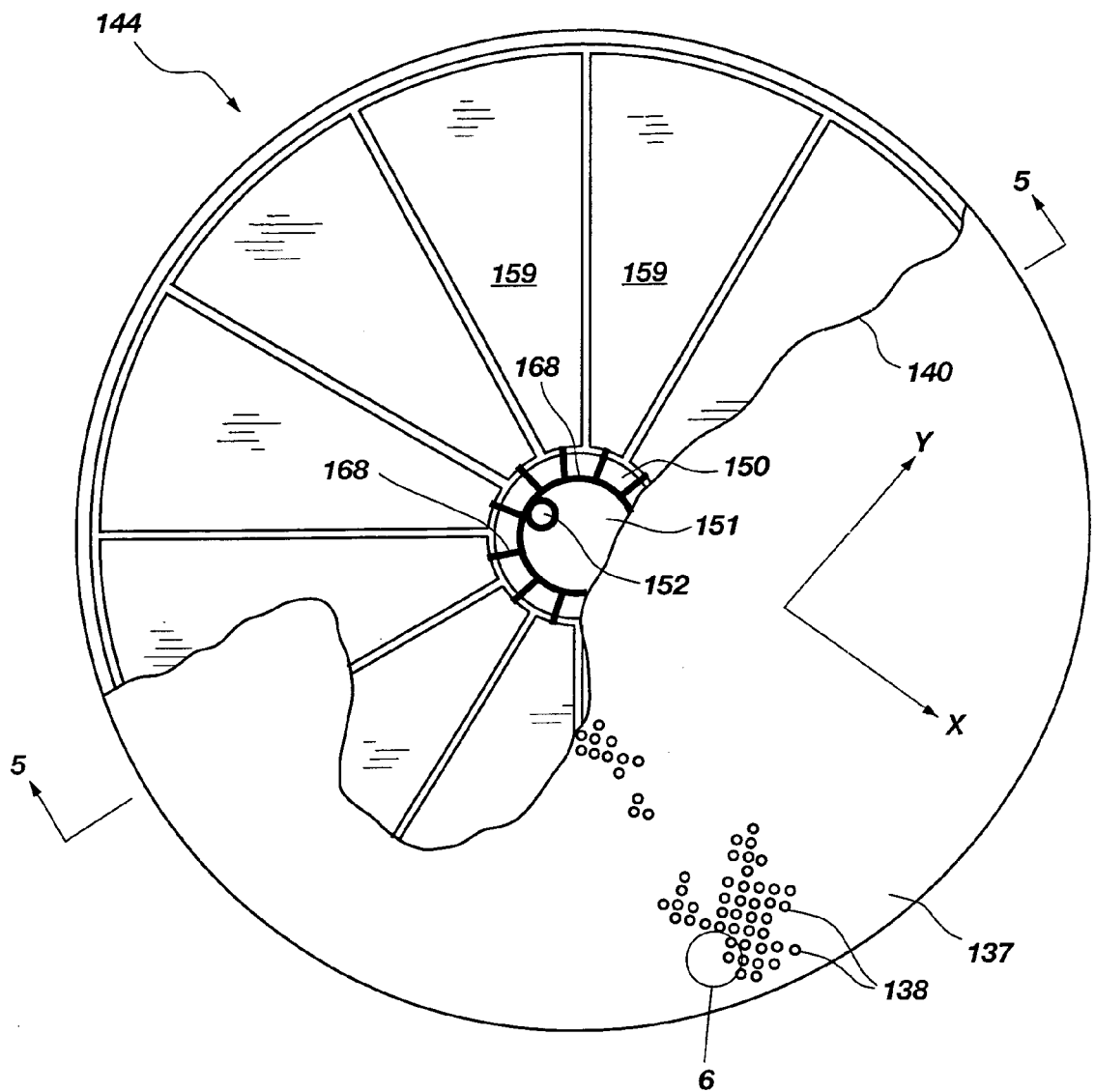
FIG. 4 is a cutaway plan view of an exemplary shower head chuck of an electrodeposition apparatus in accordance with the present invention.
Figure 6:
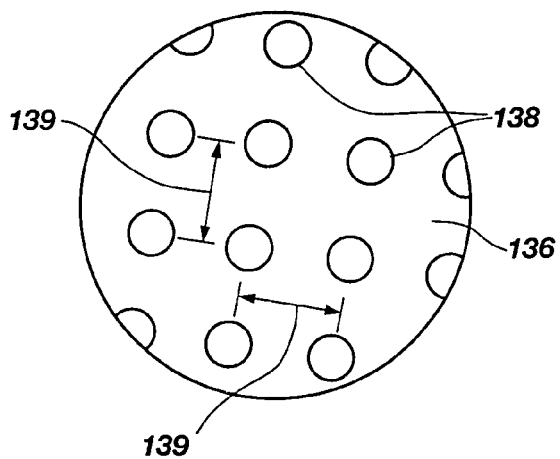
FIG. 6 is an enlargement of an exemplary mounting surface of a shower head chuck of an electrodeposition apparatus of the present invention, in accordance with portion 6 of FIG. 4.
Figure 5:
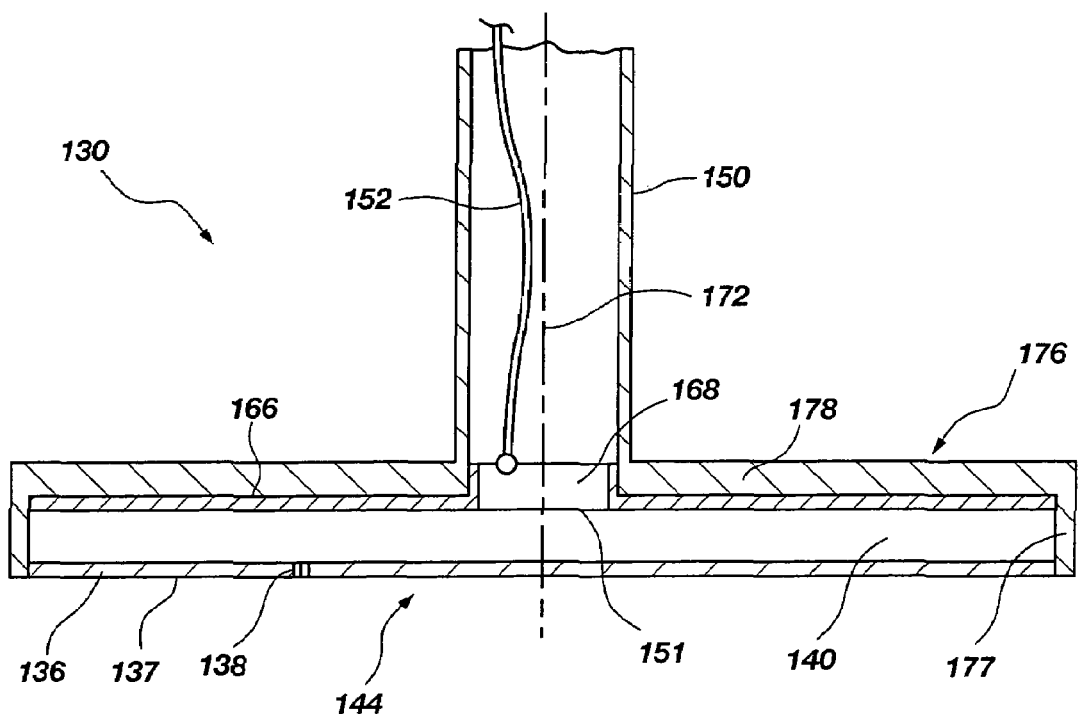
FIG. 5 is a cross-sectional side view of a portion of a shower head chuck of an electrodeposition apparatus in accordance with the present invention, as taken along line 5—5 of FIG. 4.

Illustrated in drawing FIGS. 4 and 5 is the discharge end 144 of an exemplary second chuck 130 with a cutaway view of the spray web 136. The second chuck 130 is shown with a body 176 which includes a peripheral ring 177 surrounding a solid plate 178. Drive shaft 150 is centrally joined to the solid plate 178 about axis 172. The space between the body 176 and the spray web 136 comprises the hollow core 140. Pumped reaction solution, not shown, passes into the hollow core 140 from the hollow drive shaft opening 151 and passes to each orifice 138 for discharge onto the substrates and nonsubstrate portions of the first chuck 110. In this version, the spray web 136 contains a large number of closely spaced flow orifices 138 in a regular pattern substantially covering its generally planar exit surface 137. As shown in drawing FIG. 6, the spacing 139 between the orifices 138 in the X and Y axes on the surface 137 of the second chuck 130 approximately corresponds to the spacing of plurality of dice 170 (FIG. 3) on any substrate 120 of the plurality of substrates 120, but may vary, as long as a uniform flow of reaction solution 108 floods all portions of the substrate in a uniform manner. In general, the spacing between orifices 138 in a regular pattern may vary from about 3 to 35 mm, and preferably about 3 to about 25 mm. Instead of orifices 138 formed in the web, multiple spray nozzles may be used as known in the art located on surface 137 or within recesses within surface 137. However, conventional nozzles typically have a spray pattern which may be uneven in coverage. In addition, the typical diameter of spray nozzles is many times the diameter of the nozzle opening and may severely restrict the number and spacing of nozzles which may be fixed to a shower-producing surface, i.e., the spray web.

Referring again to drawing FIGS. 4 and 5, an electrical charge may be provided to the second chuck 130 in various ways. As shown, conductive (e.g., metal) members 166 may be attached within the hollow core 140. Illustrated in drawing FIG. 4 is a plurality of electrically chargeable members 159 in the shape of sectors of a pie surrounding the opening of the hollow drive shaft 150. These members 159 may be charged by connection of each connector 168 to a single conductor 152 (as shown), or each member 159 may be individually charged as desired by connection to a separate conductor 152.

Figure 7:
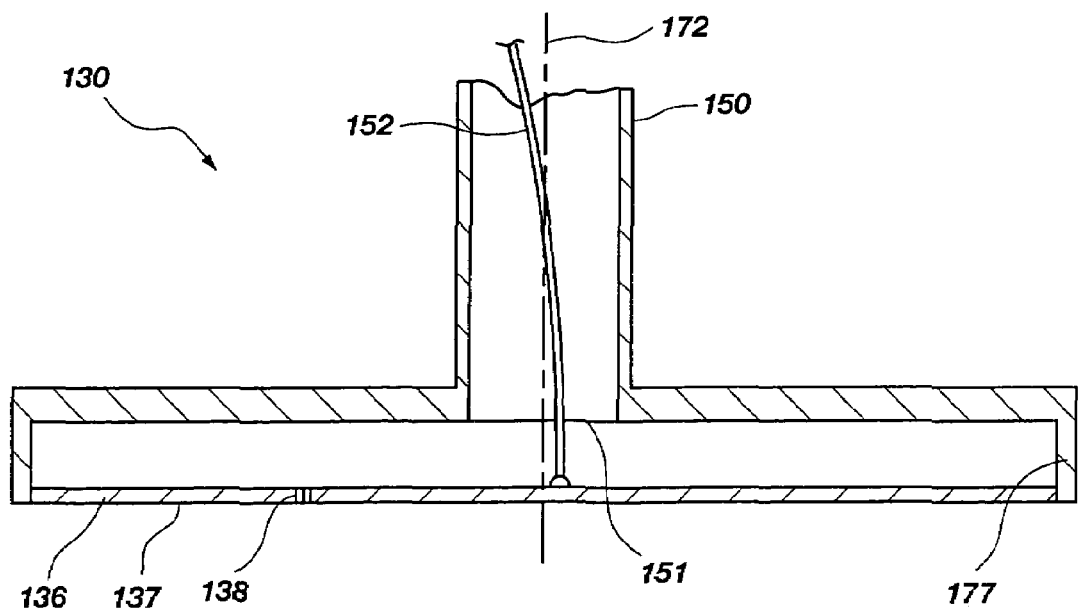
FIG. 7 is a cross-sectional side view of a portion of another embodiment of a shower head chuck of an electrodeposition apparatus in accordance with the present invention, as taken along line 5—5 of FIG. 4.

In another embodiment illustrated in drawing FIG. 7, the spray web 136 may comprise a conductive material which is connected by conductor 152 to an anode 134 (not shown in this figure) whereby the web becomes positively charged. The conductor 152 passes through the hollow drive shaft opening 151 of drive shaft 150.

As already mentioned, it is important that the spray web 136 is of a size such that all substrates 120 on the first chuck 110 will be fully flooded with newly introduced reaction solution, rather than the bulk solution in housing tank 102. This is unlike many electrodeposition methods in which the substrates are contacted fully or partially by the bulk reaction solution. In these prior art instances, the titer of the solution contacting the substrates 120 at any moment differs from place to place, even on a single wafer.

Figure 8:
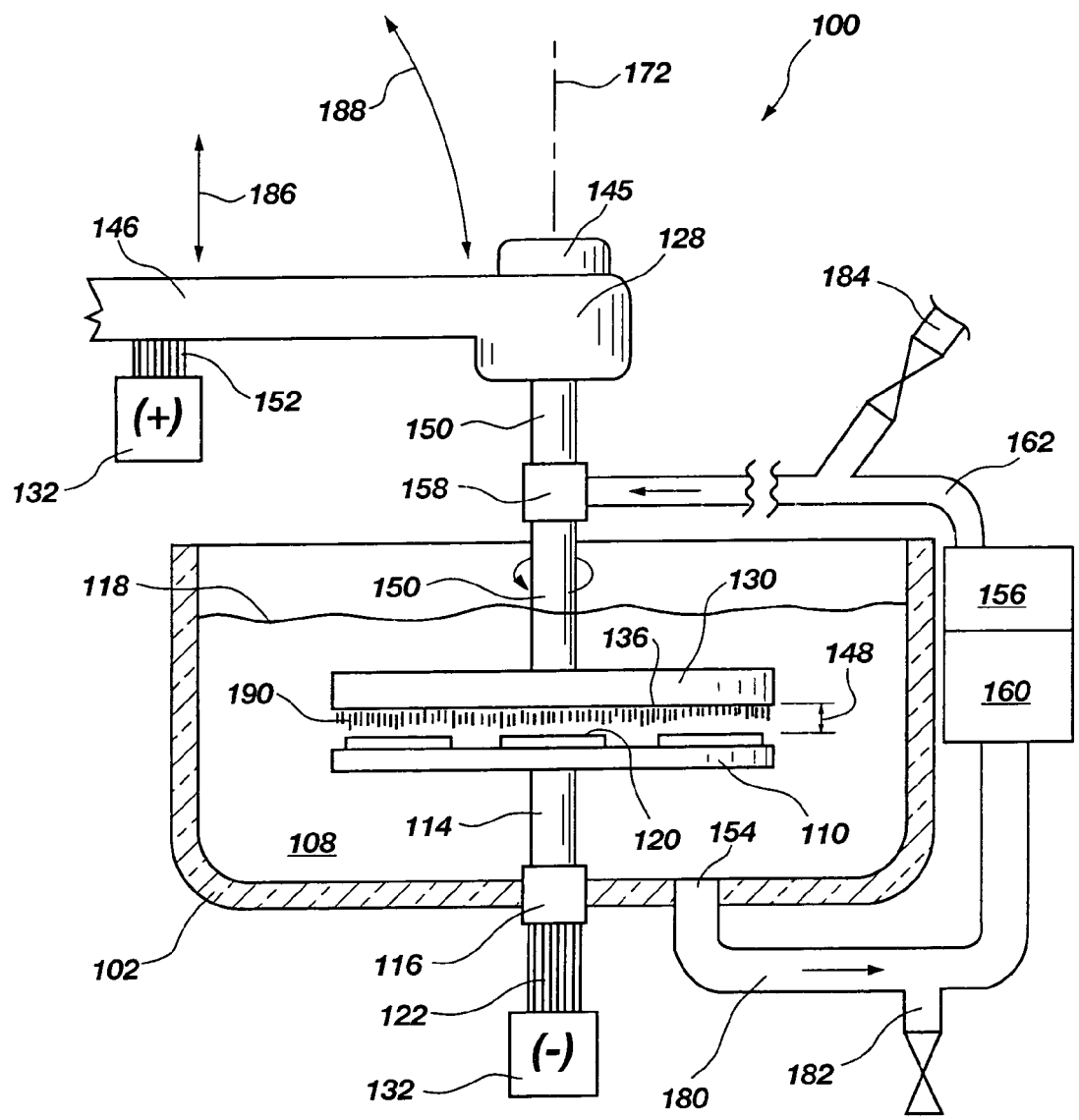
FIG. 8 is a simplified cross-sectional side view of an electrodeposition apparatus having a rotating spray head chuck in accordance with the present invention.
Figure 9:
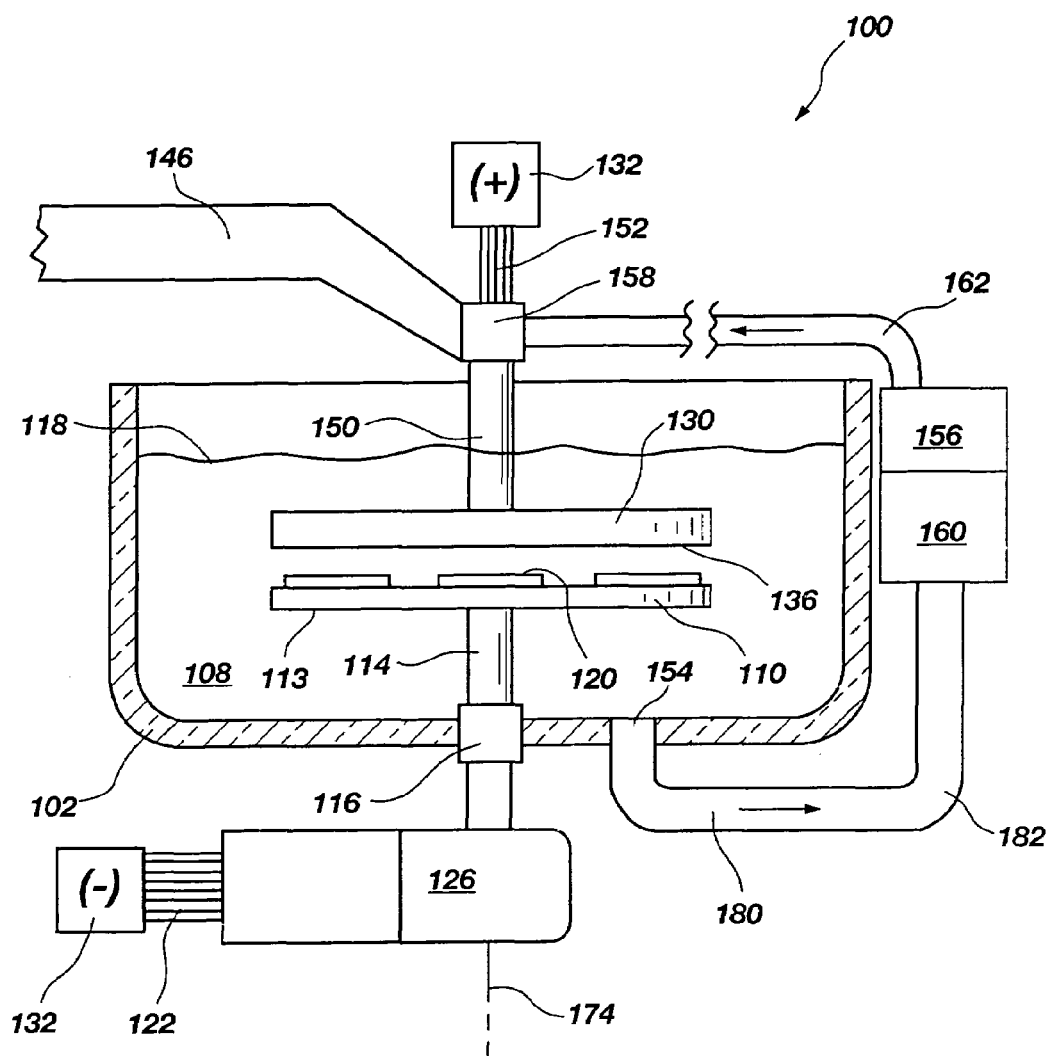
FIG. 9 is a simplified cross-sectional side view of another embodiment of an electrodeposition apparatus having a rotating substrate-retaining chuck in accordance with the present invention.
Figure 10:
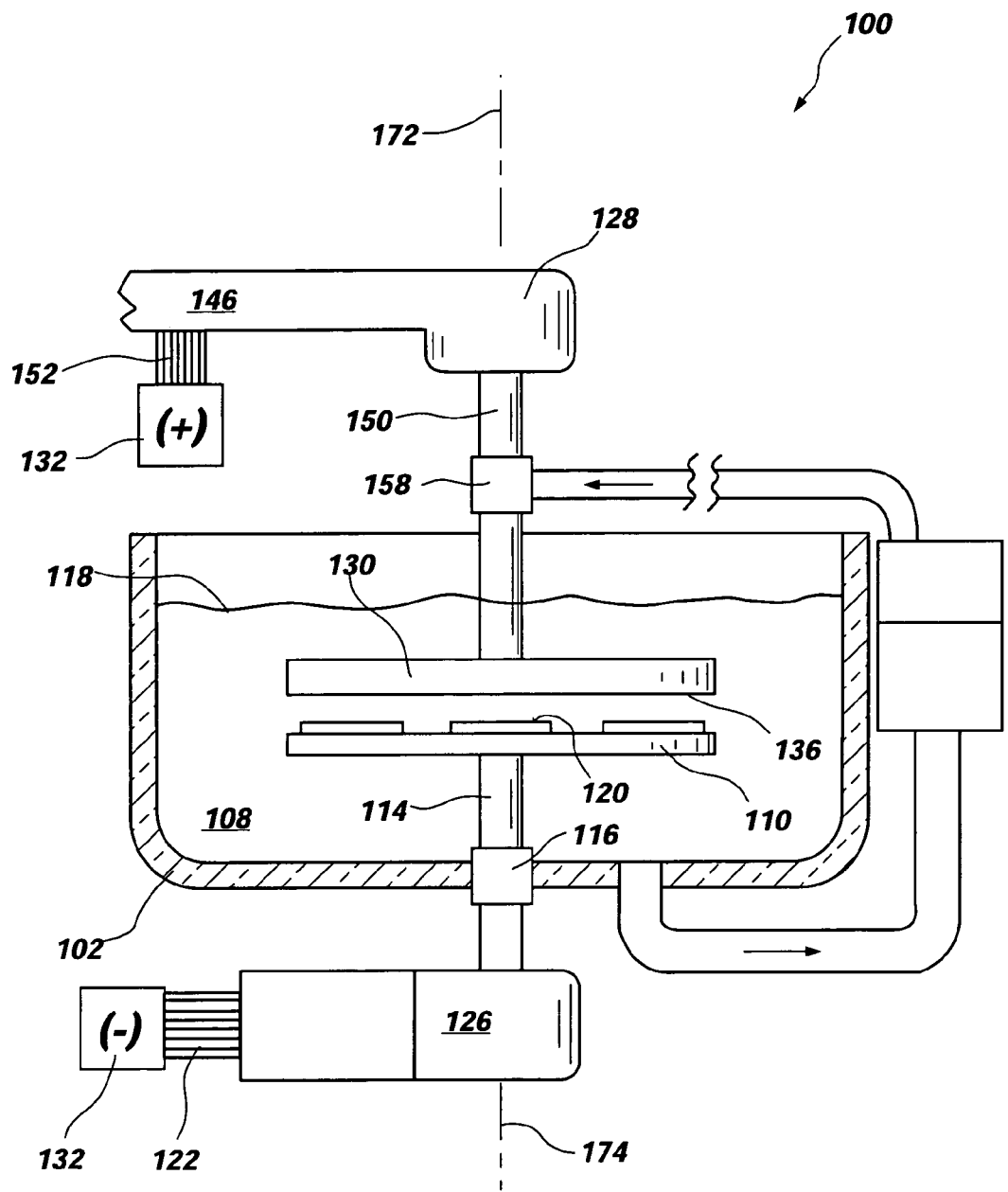
FIG. 10 is a simplified cross-sectional side view of a further embodiment of an electrodeposition apparatus having a rotating substrate-retaining chuck and a rotating shower head chuck in accordance with the present invention.

Turning now to drawing FIGS. 8, 9 and 10, electrodeposition apparatus 100 having three differing rotational configurations is shown. In each figure, a housing tank 102 containing a reaction solution 108 is shown. A first chuck 110 on which substrates 120 are substantially horizontally mounted with respect to the vertical is supported by shaft 114 to be closely positioned below a second chuck 130. The web-to-substrate spacing 148 (FIG. 8) may vary from about 1 to about 10 mm, or may be higher, depending on the flow rate of reaction solution from the second chuck 130. The second chuck 130 comprises a shower head to flood the first chuck 110 with a shower 190 of recycled reaction solution 108. The first chuck 110 is fully submerged and the second chuck 130 is at least partially submerged, i.e., below liquid level 118. The second chuck 130 is generally coextensive with the first chuck 110, or may be slightly larger to ensure complete flooding of each substrate 120. Conductors 122 and 152 from the cathode and anode, respectively, of a power supply 132 provide a negative charge to the first chuck 110 and a positive charge to the second chuck 130 to enable an electrolytic reaction therebetween. Reaction solution 108 from the housing tank 102 is shown as being recycled through piping 180 to a filter 160. The filtered solution is pumped by pump 156 to a rotary fitting 158 on the drive shaft 150 and into the second chuck 130, from which a shower 190 of solution exits to impinge upon the substrates 120. A conventional drain line 182 for draining housing tank 102 and a conventional feed line 184 for adding fresh solution, water or other liquid 108 to the second chuck 130 are also illustrated in drawing FIG. 8.

In drawing FIG. 8, the first chuck 110 is stationary while the second chuck 130 is rotated about substantially vertical axis 172 by a controllable drive 128 with a motor 145. The rotational speed may vary from about 0.1 rpm to about 3 rpm, or even higher, e.g., 5 gpm. In general, the rotational velocity is preferred to be relatively slow, e.g., about 0.2 to about 2 rpm, depending on the chuck diameters and other factors, so that laminar flow of the reaction solution 108 is maintained over the substrate surfaces.

In the embodiment of the invention illustrated in drawing FIG. 8, as in the other embodiments of apparatus 100, the control arm 146 is movable in a vertical direction 186 and/or a pivotal direction 188 wherein the second chuck 130 is alternately placed in housing tank 102 and removed therefrom. The control arm 146 may also be configured to move in other directions, not shown, for optional placement of the second chuck 130 in any of a line of processing tanks.

Illustrated in drawing FIG. 9, another embodiment of an electrodeposition apparatus 100 similar to that illustrated in drawing FIG. 8 is depicted in which the first chuck 110 is rotated about vertical axis 174 by lower drive unit 126 while the second chuck 130 is supported by control arm 146 in a stationary position during the electrodeposition process.

Illustrated in drawing FIG. 10 is an embodiment of an electrodeposition apparatus 100 in which both of the first and second chucks 110, 130 are rotatable. The rotational speed of each chuck 110, 130 may be controlled to simultaneously achieve (a) a desired differential speed between the two chucks, (b) a desired centrifugal force, and (c) a desired degree of mixing of tank contents.

Figure 11:
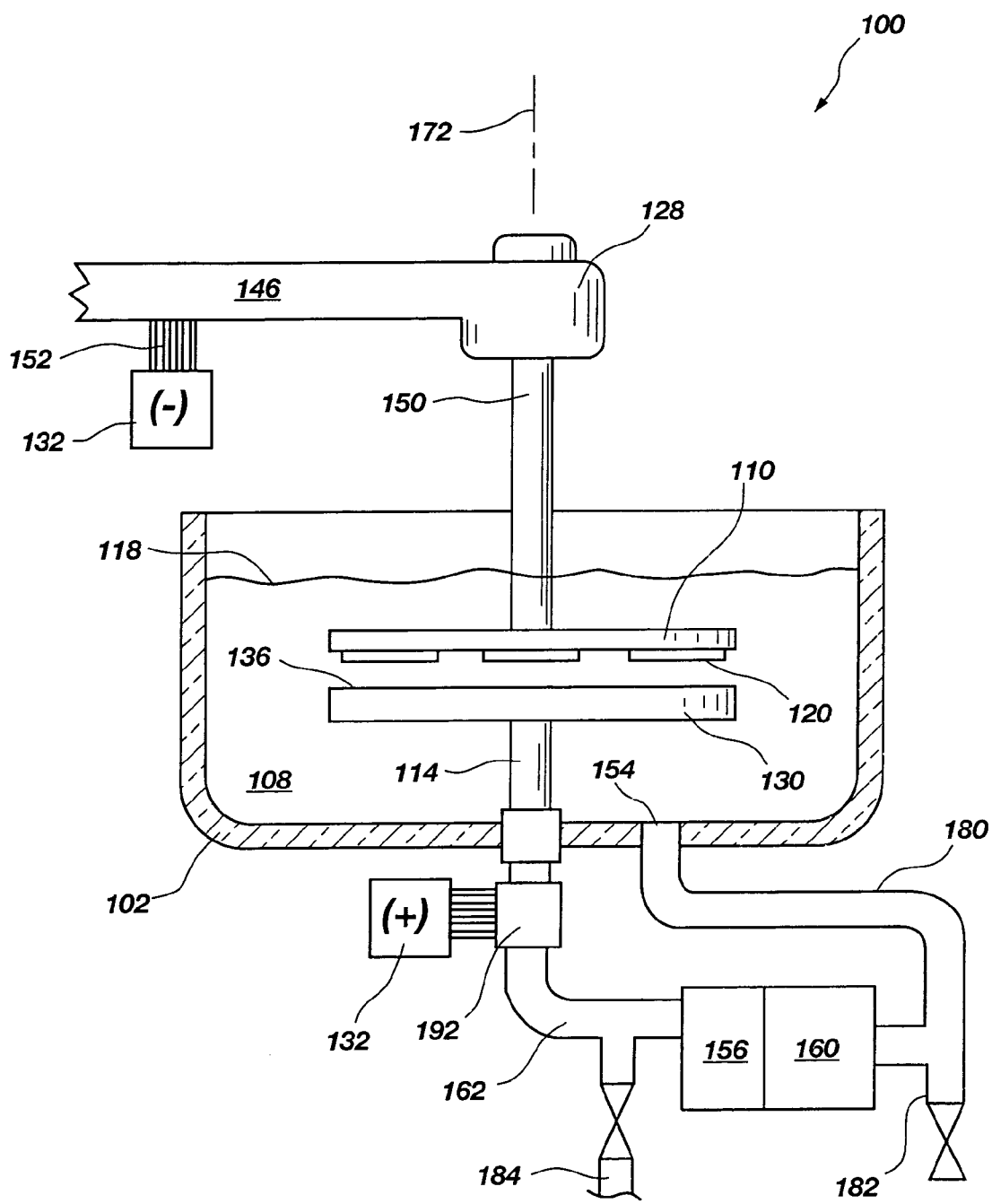
FIG. 11 is a simplified cross-sectional side view of an additional embodiment of an electrodeposition apparatus having an upper rotating substrate-retaining chuck and a nonrotating lower shower head chuck, in accordance with the invention.
Figure 12:
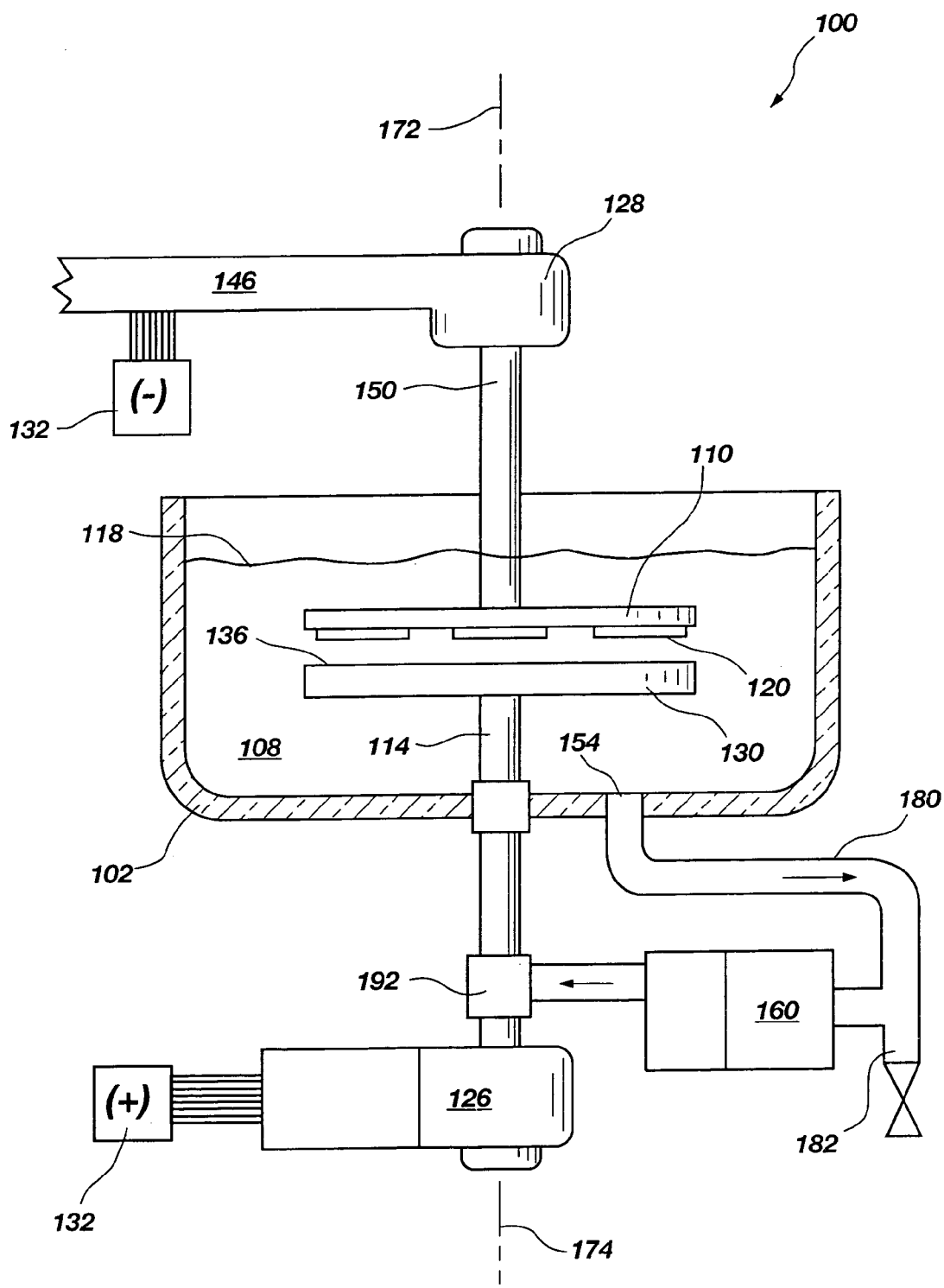
FIG. 12 is a simplified cross-sectional side view of a further embodiment of an electrodeposition apparatus in accordance with the invention.

In all of the embodiments of the invention considered thus far, it may be noted that the first chuck 110 is below the second chuck 130, and the substrates face upwardly into the discharge end 144 of the second chuck. Illustrated in drawing FIGS. 11 and 12 are further embodiments of an electrodeposition apparatus 100 in which the first chuck 110 and second chuck 130 are reversed in position. Inasmuch as the reaction solution is then "showered" upwardly at the substrate surfaces, the tendency for particles to settle in substrate recesses is negated. The same general alternatives of the present invention as illustrated in drawing FIGS. 8 through 10 are applicable here. For example, the rotated chuck(s) may comprise the first chuck 110 only, the second chuck 130 only, or both chucks together. Such alternatives are illustrated in drawing FIGS. 11 and 12.

As shown in drawing FIG. 11, the stationary first chuck 110 carrying substrates 120 is uppermost, with the substrates 120 facing downwardly toward the closely spaced spray web 136 of the second chuck 130. Both pumped reaction solution 108 and electrical connections are made through one or two rotating connectors 192, the latter being known in the art. The first chuck 110 is supported by control arm 146, which may be raised or pivoted, or moved in other directions (but not rotated) to remove substrates 120 from the housing tank 102. The control arm movement may enable sequential submersion of the substrate-carrying first chuck 110 in a line of processing tanks. Inasmuch as the solution from the spray web 136 has a relatively low velocity of a shower, solution will not be forced into the air above the liquid surface 118 around the periphery of the first chuck 110.

As illustrated in drawing FIG. 12, the embodiment of the present invention has a movable first chuck 110 which is uppermost and a movable second chuck 130 which is below the first chuck. The first chuck 110 is rotated by drive 128 and the second, i.e., lower, chuck 130 is rotated by lower drive unit 126. The drive speeds may be controlled over a relatively wide speed range to achieve the desired differential speed, centrifugal force at the substrate surfaces and tank mixing.

Figure 13:
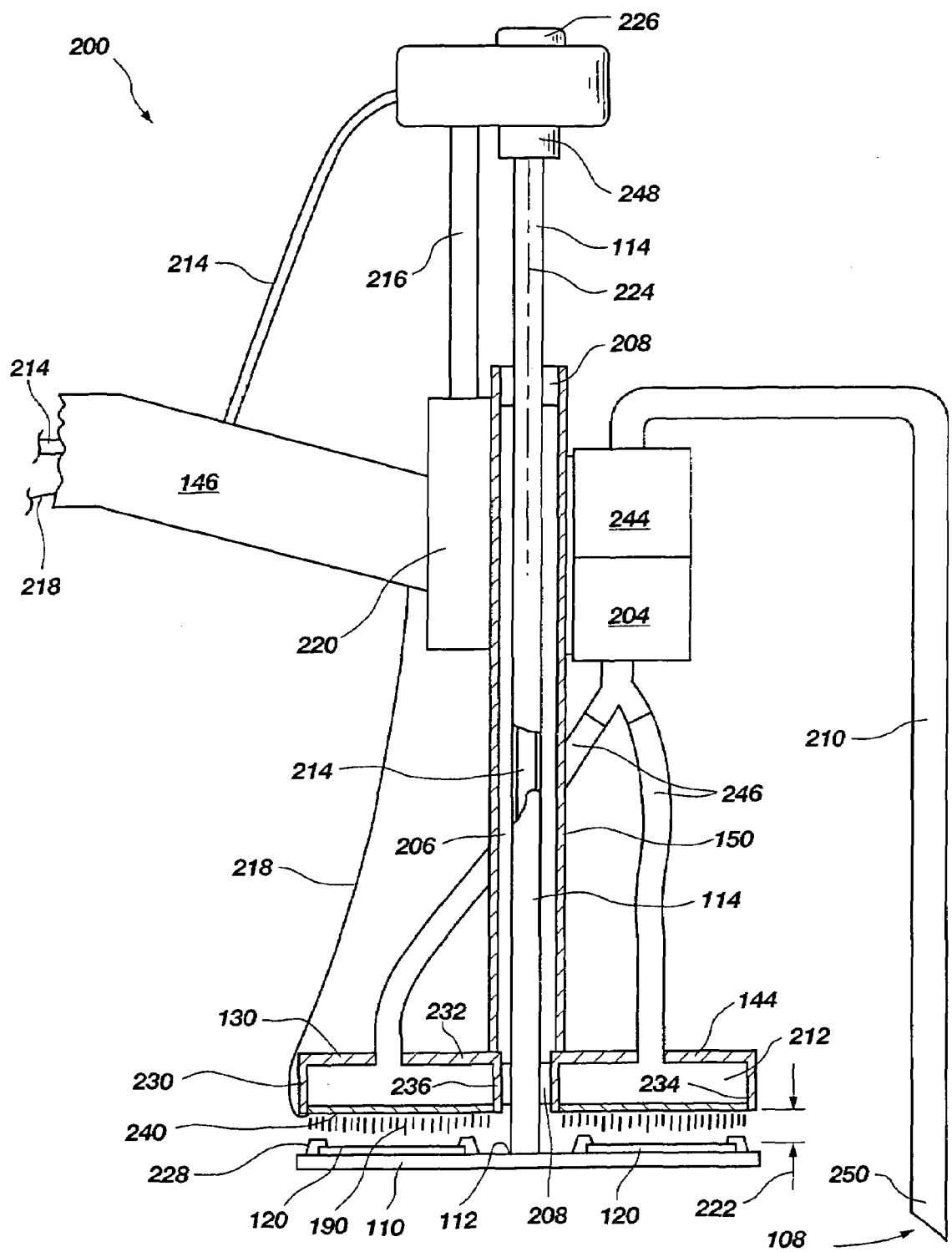
FIG. 13 is a simplified partially cross-sectional side view of another embodiment of an electrodeposition apparatus in accordance with the invention.

An embodiment of an electrodeposition assembly 200 of the present invention is especially adapted to an automatic process line and is shown in drawing FIG. 13. The assembly includes a single control arm 146, from which two chucks 110 and 130 are suspended. This permits placement into a housing tank 102 (not shown) or removal therefrom as a single unit by actuation of a single control arm 146. In this embodiment of the invention, one of the first chuck 110 and second chuck 130 has a rotatable drive shaft 114 or 150, respectively, for rotation thereby. In the embodiment of the invention illustrated in drawing FIG. 13, a drive shaft 114 for driving the first (substrate-carrying) chuck 110 is bearingly mounted coaxially within a stationary hollow drive shaft 150 of a second (spray-head) chuck 130, coincident with center axis 224. The annular space 206 between drive shaft 114 and drive shaft 150 has bearings and fluid seals 208 at its upper and lower ends. Drive shaft 114 is controllably rotatively driven by drive motor 226 shown movably mounted on linear drive shaft 216 of linear actuator 220. While drive motor 226 rotates drive shaft 114 about center axis 224, the linear drive shaft 216 is also configured to be vertically movable by linear actuator 220 to control the web-to-substrate spacing 222 or provide a vertical vector to shaft movement.

The first chuck 110 comprises a thin planar member having center axis 224 and devices 228 for attaching a plurality of substrates 120 to an upper mounting surface 112 of the chuck. The figure shows exemplary substrates 120 as semiconductor wafers which are attached to the upper mounting surface 112 by devices 228 shown as clips. Other suitable devices 228 may be used for substrate attachment, depending upon the substrate shape. The substrates 120 are provided with a negative electrical charge from a power supply, not shown, via conductors 214 which pass through a rotating connection fitting 248 (such as use brushes) into conductors in the hollow drive shaft 114 and through clips or other connectors 228 to the substrates.

The second chuck 130 has a discharge end 144 and comprises an annular disk having a nonconductive body 230 of a solid annular upper plate 232, outer peripheral ring 234 and inner peripheral ring 236. The lower planar surface comprises a web 240 which is perforated with flow orifices (not shown) for passage of reaction solution 108 therethrough as a shower 190.

A recirculation pump 204 is attached to the control arm 146. Reaction solution 108 from the housing tank 102 enters the pickup end 250 of conduit 210 and is filtered by filter 244 to remove solid particles before being pumped to a slightly elevated pressure by recirculation pump 204. The filtered reaction solution 108 is pumped through one or more conduits 246 into the hollow core 212 within the second chuck 130. Pressurized reaction solution 108 is forced through a pattern of flow orifices 138 (see FIG. 4) in spray web 136 in accordance with the specifications of the invention. A conductor 218 carries a cathodic charge from a distal power supply 132, not shown in this figure, to the spray web 136 or other chargeable surface on the second chuck 130.

In an alternative arrangement, not shown, the recirculated reaction solution 108 may be directed by a conduit 246 to the annular space 206 between the two drive shafts 114, 150. Conduits between the annular space 206 and the hollow core 212 will then enable filling the hollow core to create the shower 190. Rotating bearings with seals 208 will prevent reaction solution 108 from escaping from the annular space 206.

It may be noted that the first chuck 110 and the second chuck 130 may be reversed in position, the first chuck 110 being positioned above the second chuck 130. Thus, shaft 114 of the first chuck 110 must be larger in diameter than drive shaft 150 of the second chuck, so that drive shaft 150 may rotatively pass through it. In this con figurations, the substrates 120 will be attached to the loser surface 112 of the first chuck 110. Pumped reaction solution 108 will be passed through shaft 114 to the second chuck 130 and will be discharged upwardly to impinge upon the substrates 120.

Some of the features of apparatus 200 of the present invention are:

1. the apparatus for supporting, rotating, vertical movement, solution pickup and pumping are all mounted on a single control arm;

2. the processing tanks require no rotating shaft seals;
3. substrates may be readily attached and removed from the apparatus;
4. multiple substrates may be processed simultaneously under identical conditions; and
5. application to a continuous or semicontinuous processing line is enhanced. For example, as shown in drawing FIG. 14, the apparatus 200 may be readily moved as indicated at 253 from station A to station I in a continuous sequence 252, where each station A through I may comprise, for example, a station for electrodeposition, washing, etching, and a variety of other processes, both "wet" and "dry," without removal of substrates from the first chuck 110.

It will be evident from the above discussion that the electrodeposition apparatus 200 may be further enhanced by providing a rotation drive for both of the chucks 110 and 130. In this embodiment, it is possible to simultaneously (a) achieve a desired relative velocity between the two chucks, (b) provide a desired mixing of the tank contents, and (c) achieve a desired centrifugal force on each chuck.

In each of the embodiments of the electrodeposition apparatus 100, 200 considered so far, the rotational axes 172 and 174 have been shown as being coaxial. However, the system may be designed to have offset axes of rotation. For example, as shown in drawing FIG. 15, the first chuck 110 and second chuck 130 rotate about their centers 254, 256, respectively. The centers 254, 256 are offset a distance 258 from each other (FIG. 16), and the second chuck 130 is shown as having a diameter 260 somewhat greater than the diameter 262 of the first chuck 110 to provide complete coverage thereof by its shower 190.

In drawing FIG. 16, second chuck 130 is rotatable about its center 256 while the first chuck 110 has an axis of rotation 266 displaced from its center 254 by displacement distance 264. Again, diameter 260 is greater than diameter 262.

Illustrated in drawing FIG. 17, both chucks 110 and 130 are shown as having respective axes of rotation 266, 268 which are displaced from their centers 254, 256 (not shown), respectively. In this mode, the difference in diameters 262, 260 of the first and second chucks is generally greatest.

Displacement and/or offset of the chucks 110, 130 may be useful to ensure that every tiny portion of the substrates is subjected to equivalent contact with the reaction solution. The "path" taken by each shower orifice 138 over a substrate 120 on the first chuck 110 will constantly vary to ensure complete coverage.

Figure 18:
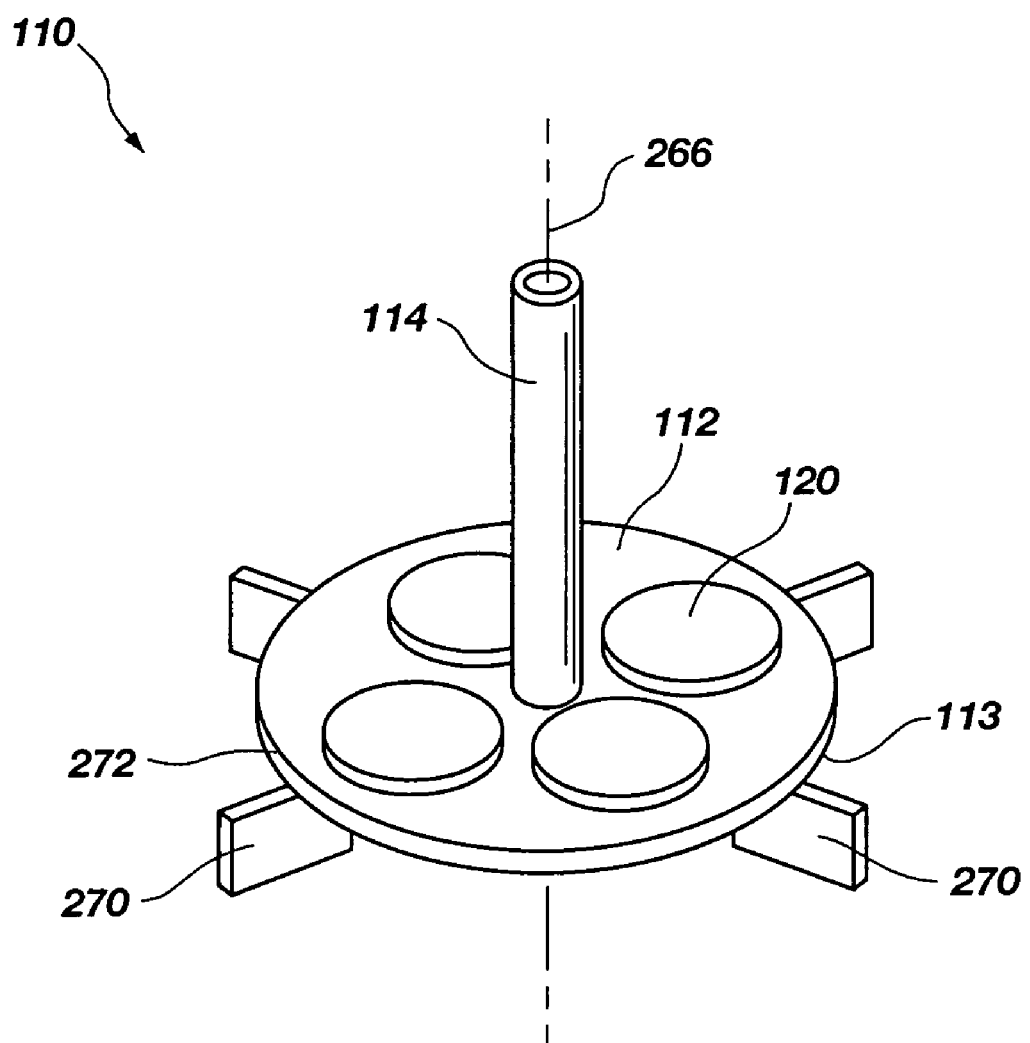
FIG. 18 is an isometric view of a rotatable chuck of an electrodeposition apparatus configured to enhance bulk mixing in a reaction tank in accordance with the invention.

With respect to each of the rotatable chucks 110, 130, agitation of reaction solution 108 in the housing tank 102 is enhanced by attaching a relatively small number of stirring blades 270 to the periphery 272 or nonactive planar surface 113 of the rotatable chuck(s) or alternatively to a submerged portion of a rotatable shaft 114 such as that positioned below a lower chuck (for example, see FIG. 12). Preferably, the stirring blades 270 are planar and mounted in a balanced radial alignment for generally equivalent mixing irrespective of the direction of rotation. The blades may take various shapes, and a preferred embodiment is generally shown in drawing FIG. 18. The number of blades 270 on a chuck may vary from about 4 for a small chuck up to about 15 for a larger chuck of about five foot diameter.

What is claimed is:

1. An apparatus for treating a substrate with a liquid solution from a liquid source in a tank, comprising:
   a first chuck for holding a plurality of substrates in a substantially horizontal plane in said tank;
   a second chuck having a web for discharging said liquid solution from said liquid solution source onto said substrates wherein the web is configured to discharge a spray pattern of said liquid solution from said liquid solution source to substantially simultaneously completely uniformly cover the substrates;
   a rotatable shaft connected to one of said first chuck and said second chuck for rotation thereof; and
   a drive unit for rotating said rotatable shaft.

2. The apparatus in accordance with claim 1, further comprising a motor connected to said drive unit for actuation thereof.

3. The apparatus in accordance with claim 1, wherein said second chuck comprises a chuck which is one of coextensive with said first chuck and larger than said first chuck.

4. The apparatus in accordance with claim 1, further comprising a first support apparatus for supporting said first chuck and a second support apparatus for supporting said second chuck, at least one of said first support apparatus and said second support apparatus comprising a rotatable shaft.

5. The apparatus in accordance with claim 1, wherein a distance between said web and said substrates comprises a controllable distance having a range from about 1 mm to about 10 mm.

6. The apparatus in accordance with claim 1, wherein said first chuck comprises a chuck for holding at least four substrates.

7. The apparatus in accordance with claim 1, wherein said first chuck comprises a chuck for holding at least six substrates.

8. The apparatus in accordance with claim 1, wherein said first chuck comprises a chuck for holding at least eight substrates.

9. The apparatus in accordance with claim 1, wherein said second chuck comprises a chuck having a hollow interior.

10. The apparatus in accordance with claim 9, further comprising:
    a support apparatus for said second chuck comprising a hollow shaft connected thereto;
    a pump for pressurizing said solution; and
    conduit apparatus for transferring said solution from said tank to said pump, from said pump to said hollow shaft, and from said hollow shaft to said hollow interior of said second chuck for discharge therefrom.

11. The apparatus in accordance with claim 10, further comprising a filter connected to said conduit apparatus removing solid particles from said solution.

12. The apparatus in accordance with claim 1, wherein said web comprises a planar member having spaced-apart orifices for passage of said solution.

13. The apparatus in accordance with claim 12, wherein a spacing of said orifices is in a range from about three mm to about twenty-five mm.

14. The apparatus in accordance with claim 12, wherein a spacing of said orifices is in a range of about three mm to about fifteen mm.

15. The apparatus in accordance with claim 1, wherein said web includes a web electrically chargeable by contacting with a charged electrode.

16. The apparatus in accordance with claim 1, wherein said web comprises an electrical conductor.

17. The apparatus in accordance with claim 1, wherein said rotatable shaft and said drive unit are supported on a movable arm.

18. The apparatus in accordance with claim 1, wherein said rotatable shaft and drive unit include a rotatable shaft supported by a drive unit positioned below said tank.

19. The apparatus in accordance with claim 1, wherein said treating comprises an electrolytic process, said apparatus further comprising:
- a power supply with an anode terminal and a cathode terminal;
- a first conductor for connecting a first terminal to said substrates; and
- a second conductor for connecting a second terminal to said web.

20. The apparatus in accordance with claim 19, further comprising a second, hollow shaft supporting said first chuck, said first conductor passing through said second, hollow shaft for connecting to said first chuck.

21. The apparatus in accordance with claim 20, wherein said treating comprises electrodeposition, said first terminal comprising a cathode and said second terminal comprising an anode.

22. The apparatus in accordance with claim 20, wherein said treating comprises one of electroetching and electrocleaning, said first terminal comprising an anode and said second terminal comprising a cathode.

23. The apparatus in accordance with claim 20, said second conductor passing through said hollow shaft for connecting to said second chuck.

24. An apparatus for treating a substrate with a liquid reaction solution from a liquid reaction solution source solution in a container, comprising:
- a first chuck for holding a plurality of substrates in a generally horizontally planar position;
- first support apparatus for holding said first chuck in a horizontal attitude within said container;
- a second chuck having a planar web for discharging said liquid reaction solution from said liquid reaction solution source onto said substrates;
- second support apparatus for holding said second chuck in a position, said planar web located substantially parallel to said substrates wherein the web is configured to discharge a spray pattern of said liquid reaction solution from said liquid reaction solution source to substantially simultaneously completely uniformly cover the substrates;
- a rotatable shaft connected to one of said first chuck and said second chuck for rotation thereof; and
- a drive unit for rotating said rotatable shaft and attached chuck.

25. The apparatus in accordance with claim 24, further comprising a motor connected to said drive unit for actuation thereof.

26. The apparatus in accordance with claim 24, wherein said second chuck includes a chuck being one of coextensive with said first chuck and larger than said first chuck.

27. The apparatus in accordance with claim 24, wherein at least one of said first support apparatus and said second support apparatus comprises a rotatable shaft.

28. The apparatus in accordance with claim 24, wherein a distance between said web and said substrates includes a controllable distance to provide a minimum value in a range of about 1 mm to about 10 mm.

29. The apparatus in accordance with claim 24, wherein said first chuck includes a chuck for holding at least four substrates.

30. The apparatus in accordance with claim 24, wherein said first chuck includes a chuck for holding at least six substrates.

31. The apparatus in accordance with claim 24, wherein said first chuck includes a chuck for holding at least eight substrates.

32. The apparatus in accordance with claim 24, wherein said second chuck includes a chuck having a hollow interior.

33. The apparatus in accordance with claim 32, wherein said second support apparatus for said second chuck has a hollow shaft connected thereto, said apparatus further comprising:
- a pump for pressurizing said reaction solution; and
- conduit apparatus for transferring said reaction solution from said container to said pump, from said pump to said hollow shaft, and from said hollow shaft to said hollow interior of said second chuck for discharge therefrom.

34. The apparatus in accordance with claim 33, further comprising a filter connected to said conduit apparatus for removing solid particles from said reaction solution.

35. The apparatus in accordance with claim 24, wherein said web comprises a planar member having spaced-apart orifices for passage of said reaction solution.

36. The apparatus in accordance with claim 35, wherein a spacing of said orifices is in a range from about three mm to about twenty-five mm.

37. The apparatus in accordance with claim 35, wherein a spacing of said orifices is in a range from about three mm to about fifteen mm.

38. The apparatus in accordance with claim 24, wherein said web includes a web electrically chargeable by contact with a charged electrode.

39. The apparatus in accordance with claim 24, wherein said web comprises an electrical conductor.

40. The apparatus in accordance with claim 24, wherein said rotatable shaft and drive unit are supported on a movable arm.

41. The apparatus in accordance with claim 24, wherein said rotatable shaft and drive unit are supported and rotated by apparatus having at least a portion thereof positioned below said container.

42. The apparatus in accordance with claim 24, wherein said treating comprises an electrolytic process, said apparatus further comprising:
- a power supply with an anode terminal and a cathode terminal;
- a first conductor for connecting a first terminal to said substrates; and
- a second conductor for connecting a second terminal to said web.

43. The apparatus in accordance with claim 42, further comprising a second, hollow shaft supporting said first chuck, said first conductor passing through said second, hollow shaft and connected to said first chuck.

44. The apparatus in accordance with claim 43, wherein said treating comprises electrodeposition, said first terminal including a cathode and said second terminal including an anode.

45. The apparatus in accordance with claim 43, wherein said treating comprises one of electroetching and electrocleaning, said first terminal including an anode and said second terminal including a cathode.

46. The apparatus in accordance with claim 43, wherein said second conductor includes a conductor passing through said second, hollow shaft and connected to said second chuck.

47. A treatment apparatus for treating substrates with a liquid reaction solution from a liquid reaction solution source within a tank, comprising:
- a first chuck having a planar surface;
- attaching apparatus for attaching a plurality of substrates to said planar surface of said first chuck;

a first shaft supporting said first chuck;

a second chuck having a shower head side and including a planar web with a uniform pattern of orifices therein covering said shower head side for forming a hollow core therein wherein the web is configured to discharge a spray pattern of said liquid reaction solution from said liquid reaction solution source to substantially simultaneously completely uniformly cover the substrates;

a second shaft supporting said second chuck; and fluid apparatus for introducing said liquid reaction solution from said liquid reaction solution source to said hollow core of said second chuck.

48. The treatment apparatus in accordance with claim 47, further comprising rotating apparatus for rotating at least one of said first shaft and said second shaft about substantially vertical axes.

49. The treatment apparatus in accordance with claim 47, wherein the planar surface of said first chuck faces upwardly toward said web of said second chuck.

50. The treatment apparatus in accordance with claim 49, wherein said first shaft includes a shaft for passing through said second shaft.

51. The treatment apparatus in accordance with claim 47, wherein the planar surface of said first chuck faces downwardly toward said web of said second chuck.

52. The treatment apparatus in accordance with claim 47, wherein said uniform pattern of orifices comprises a pattern having orifice spacing in a range of about 3 mm to about 35 mm.

53. The treatment apparatus in accordance with claim 47, wherein said uniform pattern of orifices comprises a pattern having an orifice spacing in a range of about 3 mm to about 25 mm.

54. The treatment apparatus in accordance with claim 47, wherein said planar surface of said first chuck includes a surface for attaching at least four substrates thereto.

55. The treatment apparatus in accordance with claim 47, wherein said planar surface of said first chuck includes a surface for attaching at least six substrates thereto.

56. The treatment apparatus in accordance with claim 47, further comprising apparatus for introducing an electrical charge to said substrates and an opposing electrical charge to a portion of said second chuck.

57. The treatment apparatus in accordance with claim 56, wherein said apparatus for introducing includes at least one brush contact assembly for passing said electrical charge to conductors within said first and second shafts.

58. The treatment apparatus in accordance with claim 47, further comprising:

a control arm supporting said first chuck and said second chuck;

a motorized drive attached to said control arm for rotating at least one of said first chuck and second chuck; and control apparatus for controlling a speed of said at least one of said first chuck and second chuck.

59. The treatment apparatus in accordance with claim 58, further comprising apparatus for moving one of said first chuck and said second chuck in a vertical direction relative to the other of said first chuck and said second chuck.

60. The treatment apparatus in accordance with claim 59, wherein said apparatus for moving comprises a linear actuator.

61. The treatment apparatus in accordance with claim 47, wherein said first chuck and said second chuck each include a chuck for rotation by a drive apparatus.

62. The treatment apparatus in accordance with claim 61, wherein said first chuck includes a chuck having an axis of rotation which coincides with an axis of rotation of said second chuck.

63. The treatment apparatus in accordance with claim 61, wherein said first chuck has an axis of rotation which is displaced from an axis of rotation of said second chuck.

64. The treatment apparatus in accordance with claim 61, wherein at least one of said first chuck and said second chuck has an axis of rotation displaced from a center thereof.

65. The treatment apparatus in accordance with claim 61, further comprising a plurality of mixing blades attached to at least one of a back side and a periphery of at least one rotatable chuck.

* * * * *

UNITED STATES PATENT AND TRADEMARK OFFICE
CERTIFICATE OF CORRECTION

| | | |
|---|---|---|
| PATENT NO. | : 7,090,750 B2 | Page 1 of 1 |
| APPLICATION NO. | : 10/228505 | |
| DATED | : August 15, 2006 | |
| INVENTOR(S) | : Akram et al. | |

It is certified that error appears in the above-identified patent and that said Letters Patent is hereby corrected as shown below:

In column 13, line 27, in Claim 24, before "in a" delete "solution".

Signed and Sealed this

Twenty-fifth Day of March, 2008

JON W. DUDAS
*Director of the United States Patent and Trademark Office*